United States Patent
Ghosh et al.

(10) Patent No.: US 8,327,315 B1
(45) Date of Patent: Dec. 4, 2012

(54) SYSTEM AND METHOD FOR PROCESS RULES EDITORS

(75) Inventors: Sandipan Ghosh, Delhi (IN); Hitesh Marwah, Uttar Pradesh (IN); Pawan Fangaria, Uttar Pradesh (IN); Arbind Kumar, Uttar Praesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 668 days.

(21) Appl. No.: 12/114,530

(22) Filed: May 2, 2008

(51) Int. Cl.
 *G06F 17/50* (2006.01)
(52) U.S. Cl. ........ 716/139; 716/102; 716/103; 716/106; 716/111; 716/122
(58) Field of Classification Search .......... 716/100–108, 716/111, 122, 139
See application file for complete search history.

(56) References Cited

U.S. PATENT DOCUMENTS

| | | | |
|---|---|---|---|
| 7,418,683 B1 * | 8/2008 | Sonnard et al. | 716/122 |
| 2006/0218512 A1 * | 9/2006 | Arslan et al. | 716/4 |
| 2009/0113369 A1 * | 4/2009 | Colwell et al. | 716/11 |
| 2009/0300570 A1 * | 12/2009 | Chan | 716/11 |

* cited by examiner

*Primary Examiner* — Paul Dinh
(74) *Attorney, Agent, or Firm* — Kenyon & Kenyon LLP

(57) ABSTRACT

According to various embodiments of the invention, a system and method for editing process rules for circuit design through a graphical editor is provided. In some embodiments, the graphical editor is a circuit design tool that provides the user of the tool, such as a circuit designer or process engineer, the ability to visualize, modify, create, or remove process rules through a graphical user interface ("GUI"). These process rules, also known as constraints or circuit design constraints, relate to the layout of circuits and is grouped into constraint groups (also known as "circuit design constraint groups") that can be associated to specific circuit design objects.

21 Claims, 6 Drawing Sheets

SYSTEM AND METHOD FOR PROCESS RULES EDITORS

TECHNICAL FIELD

The present invention relates to design tools, and more particularly, some embodiments relate to a system and method for circuit design tools for creating, deleting, modifying, and visualizing process rules for circuit designs.

DESCRIPTION OF THE RELATED ART

Circuit designs are becoming much more complex as the world moves toward denser chips with smaller features. As the complexity of circuits increase, so does the complexity of process rules for circuit designs. In addition, with different variants of processes now being used in circuit design and a need to apply different process rules to different sections of a large mixed signal chip (e.g. different minWidth for power nets in certain area of chip), the complexity of the process rules has increased.

Usually the circuit design starts at the front end where the design is created and simulated at the abstract and logical level. A typical design comprises nets and guides on a schematic canvas. The circuit design takes on a concrete level of design at the back end. The concrete design comprises shapes and polygons where wires (guides) are drawn in between the nets. Process rules play a role in the back end, guiding how polygon shapes and wires between nets are drawn (such as minimum width, spacing, symmetry, alignment, etc). The rules are housed in either a technology Open Access (OA) database or a design Open Access database. The traditional order in which rules usually apply to a design object is as follows: the design object's (net or guide) rules, the rules from the design containing the design object, and then the rules from the technology for which the design is made. When an additional process rule is applied to a design object, it overrides the hierarchy of rules that already apply to the design object and are henceforth considered a process rule override.

A conventional approach to applying process rule overrides to circuit designs is through a text file known as technology file. The large amount of complex data is organized into multiple process technology files containing many process rules. Since these technology files are ASCII based, the user needs to learn and follow strict syntax and semantics of the technology file. The technology files are capable of handling complicated data types (such as two dimensional table), various types of constraint groups, and relationships between constraint groups. In order to validate the technology file, the user performs multiple iterations of compiling and correcting the technology files.

BRIEF SUMMARY OF EMBODIMENTS OF THE INVENTION

According to various embodiments of the invention, a system and method for editing process rules for circuit design through a graphical editor is provided. In some embodiments, the graphical editor is a circuit design tool that provides the user of the tool, such as a circuit designer or process engineer, the ability to visualize, modify, create, or remove process rules through a graphical user interface ("GUI"). These process rules, also known as constraints or circuit design constraints, preferably relate to the layout of circuits and can be grouped into constraint groups (also known as "circuit design constraint groups") that can be associated to specific circuit design objects.

In one embodiment the graphics editor improves the user's ability to visualize, modify, create and remove process rules and circuit design constraint groups over the abilities of using technology files. In this embodiment, The graphics editor allows for dynamic editing of process rules without the need for recompilation of technology files. This embodiment also reduces the possibility of syntactical and semantically errors that plagues the use of technology files.

According to an embodiment of the invention, the graphical editor receives a selection of a circuit design object or a circuit design constraint from a circuit design integrated design environment ("IDE"), such as Cadence Virtuoso Layout Suit XL or GXL. Based on the selection of a circuit design object or a circuit design constraint within the integrated development environment, the circuit design constraint groups that are relevant to the selection are retrieved from a circuit design object store (e.g. OpenAccess database). The relevant constraint groups retrieved are then displayed in a graphical interface, such as a browser tree.

In yet another embodiment of the invention, a new circuit design constraint group can be created through a graphical input field, such as a text box. Subsequently, this new circuit design constraint group is added to the circuit design object store. Inversely, an existing circuit design constraint group selected from the browser tree can be removed through a graphical interface, such as graphical button. This removal is saved the circuit design object store.

In another embodiment of the invention, when a circuit design constraint group is selected on the browser tree, all the circuit design constraints belonging to the constraint group are retrieved from the design object store, which in addition to storing design constraint groups also stores both standard circuit design constraints and user-defined circuit design constraints. When a circuit design constraint is selected on the browser tree, a graphical user interface widget capable of viewing or modifying the circuit design constraint is invoked. An example of such a graphical user interface widget is a graphical editor panel. A graphical editor panel, or editor panel, displays the circuit design constraint's attributes retrieved from the design object store, which contains the value of the constraint, and the registry, which contains data used to filter constraint information retrieved from the design object store. Example implementations of a registry include, but are not limited to, a configuration file and a database. In addition to filtering information, the registry also stores a textual description for constraints and stores the path to a representative image of the constraint.

In some embodiments, the appearance of the graphical editor panel is based upon the value type or data type of the circuit design constraint's attribute. The data and value types of the attributes can include, but are not limited to, integers, floats, one-dimensional tables, 2-dimensional tables, booleans, and arrays. For example, if the attribute is a two-dimensional table, a graphical interface resembling a two-dimensional table is displayed in the graphical editor panel. The graphical editor panel can modify the attributes it displays and save those modifications to the design object store, registry, or both, based upon the type of attribute modified. In addition, the editor panel can display and modify a textual description or image associated with the circuit design constraint. Such descriptions, image paths, and associations are stored within the registry.

In yet another embodiment of the invention, a circuit design constraint group can be applied and added to another circuit design constraint group that is being displayed in the browser tree through a graphical interface, such as graphical button and graphical pull-down box.

In another embodiments of the invention, the browser tree displays the circuit design constraints based on their order of precedence in relation to each other. For example, the circuit design constraints with the highest order of precedence would appear at the top of the list of circuit design constraints belonging to a particular circuit design group, while the circuit design constraint with the lowest order of precedence would be displayed at the bottom of the list of circuit design constraints belonging to the same circuit design constraint group.

In yet another embodiment of the invention, the order of precedence of a circuit design constraint selected from the browser tree can be modified through a graphical interface, such as graphical button that either moves the circuit constraint higher in order of precedence or lower. This modification can then be stored in the design object store.

In another embodiment of the invention, a new circuit design constraint can be created through a graphical input, such as a text box, field and added to a circuit design constraint group that is being displayed in the browser tree. This new circuit design constraint and its association to the constraint group are added to the design object store. Inversely, an existing circuit design constraint selected from the browser tree can be removed from a design constraint group through a graphical interface, such as graphical button. This removal is saved to the design object store.

In yet another embodiment of the invention, the invention can be used as a viewer and browser for process rules present in technology and design databases.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward a system and method for creating, editing, displaying and viewing circuit design process rules graphically with a design tool.

Figure 6:
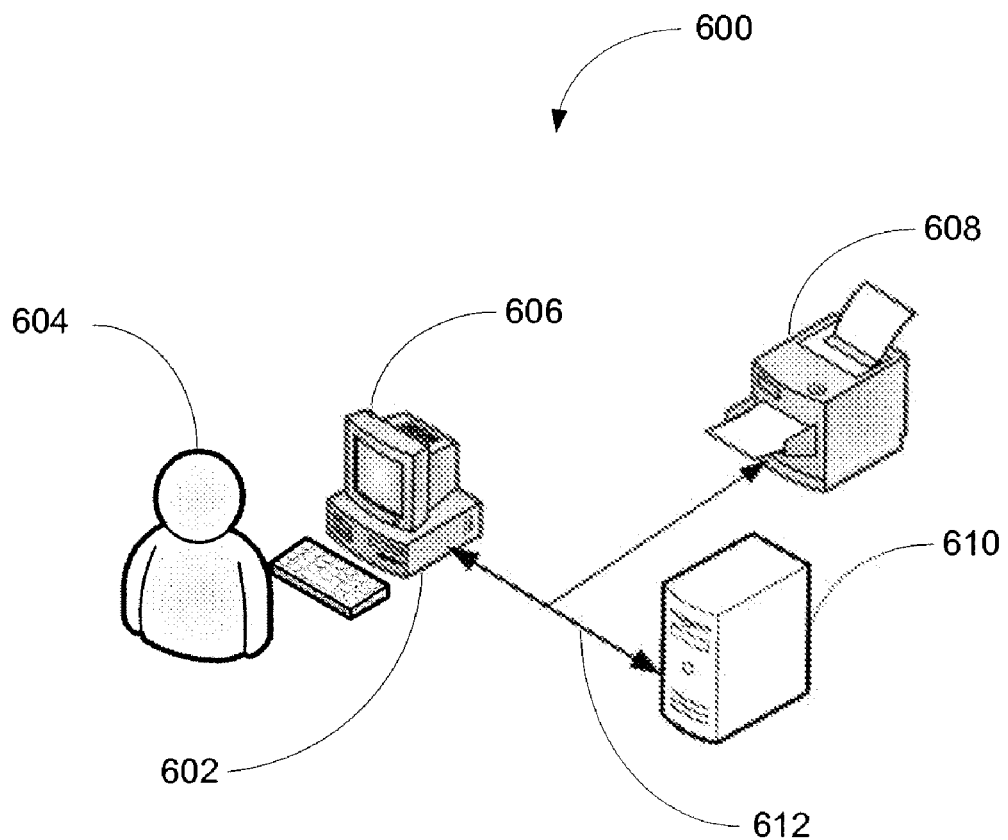
FIG. 6 is a diagram illustrating an example environment in which the systems and methods described herein can be implemented.

Before describing the invention in detail, it is useful to describe an example environment with which the invention can be implemented. One such example is illustrated in FIG. 6. FIG. 6 depicts a computer aided design system 600 that can be used by a designer 604 to design, for example, electronic circuits. System 600 can include a computer 602 and a monitor 606. The computer can be a laptop computer, desk top computer, handheld computer, mainframe computer, etc. Any computing system capable of running software implementing the systems and methods described herein can be used. Monitor 606 can be a CRT, flat screen, etc.

The designer 604 can input the design into computer 602 using various peripherals such as a mouse, keyboard, track ball, etc. If computer 602 is a mainframe, designer 604 can access computer 602 using, for example, a dumb terminal. Additionally, computer 602 can be connected to a printer 608 and a server 610 using a network 612. Server 610 can, for example, be used to store additional software programs and data. In one embodiment software implementing the systems and methods described herein can be stored on a hard drive in server 610. Thus, the software can be run from the hard drive in server 610. In another embodiment software implementing the systems and methods described herein can be stored on a hard drive in computer 602. Thus, the software can be run from the hard drive in computer 602. Therefore, in this embodiment, the software can be used weather or not computer 602 is connected to network 612. In yet another embodiment printer 608 can be connected directly to computer 602. Thus, computer 602 can print whether or not it is connected to network 612.

Computers 602, servers 610, printers 608, and computer networks 612 are well known. Therefore, for the sake of brevity, other example environments will not be discussed. It will, however, be apparent to those of skill in the art that the systems and methods described herein can be used in conjunction with many different environments. Additionally, a computer system 500 will be discussed in more detail with respect to FIG. 5. Computer system 500 can be the same as or similar to computer 602.

From time-to-time the present invention is described herein in terms of the example environment. Description in terms of the environment is provided to allow the various features and embodiments of the invention to be portrayed in the context of an exemplary application. After reading this description, it will become apparent to one of ordinary skill in the art how the invention can be implemented in different and alternative environments.

Figure 1:
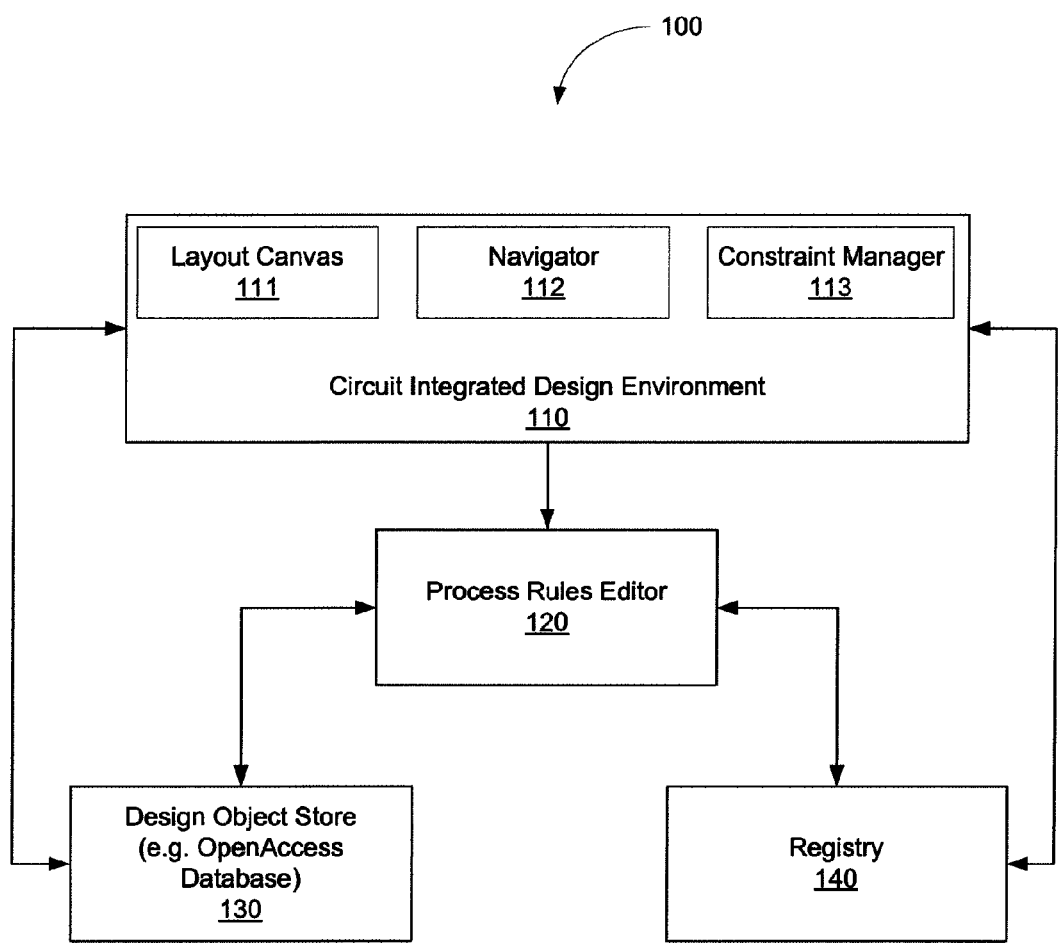
FIG. 1 is a diagram illustrating an example implementation of the present invention.

According to an embodiment of the invention, the graphical editor receives a selection of a circuit design object or a circuit design constraint from an circuit design integrated design environment ("IDE"), such as, for example, the Cadence Virtuoso Layout Suit XL or GXL. FIG. 1 is a diagram illustrating an example implementation of such an embodiment. The example system 100 includes an integrated design environment 110, a process rules editor 120 (PRE), a design object store 130, and a registry 140. An example of the integrated design environment 110 (integrated development environment) can include, but is not limited to, a Circuit Layout design tool, a Printed Circuit Board (PCB) design tool, or a IC-Digital design tool. The 110 integrated development environment can comprise of one or more graphical interface assistants. In the case of a circuit layout design tool, examples of such graphical interface assistants include, but are not limited to, a navigator 112, a constraint manager 113, or a layout canvas 111. A graphical interface such as a navigator 112 can be configured to list design objects. A graphical interface such as a constraint manager 113 can be configured to list the constraints of a design. A graphical interface such as layout canvas 111 can be configured to display the layout of a design.

In one embodiment of the invention, a user 604 would input a selection into a circuit design integrated development environment 110, such as Cadence Virtuoso Suit XL, running on a computer system 606. The user 604 would make the selection using one of the graphical interface assistances (layout canvas 111, navigator 112, constraint manager 113). This selection would be relayed to the process rules editor (PRE) 120 which, in turn, processes the selection, as illustrated in FIG. 2.

Figure 2:
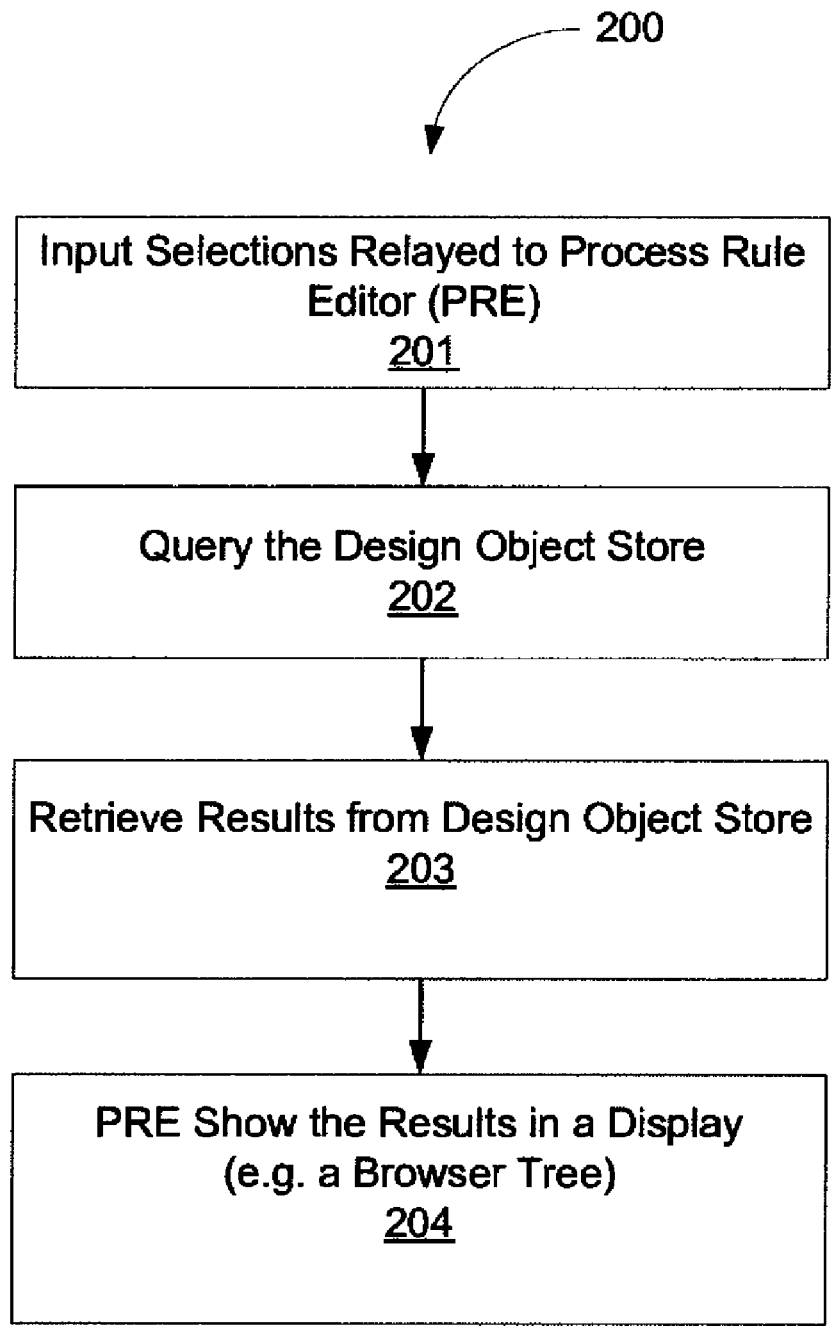
FIG. 2 is a flowchart illustrating an example method of processing an input selection from a source external in accordance with one embodiment of the systems and methods described herein.

FIG. 2 is a flowchart illustrating an example method of processing an input selection from a source external in accordance with one embodiment of the systems and methods described herein. The method 200 begins at block 201 when input selections are received from a source that is either internal or external to the PRE. Usually the input selection received comprises a design object (net or guide). An example of an internal source for input selection is a graphical drop down box that is part of the PRE 120 graphical user interface. An example of an external source for the selection input would be another design tool, such as an integrated development environment 110.

Based on the selection of a circuit design object or a circuit design constraint made through the graphical interface, the circuit design constraint groups that are relevant to the selection are retrieved from a circuit design object store. A circuit design object store is an example of a design object store 130. An additional example of a design object store 130 can include, but is not limited to, a technology OpenAccess database and a design OpenAccess database. A design object store 130 such as a circuit design object store can store data that include, but are not limited to, constraint groups, design objects, associations between constraint groups and design objects, and constraints. An integrated development environment 110, such as Virtuoso, makes use of the design objects and constraint groups stored in the design object store 130.

In block 202 the PRE queries the design object store 130 for the constraint groups pertinent to the selected circuit design object. The results of the query are sent back to the PRE 120 which retrieves the result in block 203. The results can include, but are not limited to, default circuit design constraint groups or a user-defined circuit design constraint groups.

Figure 4:
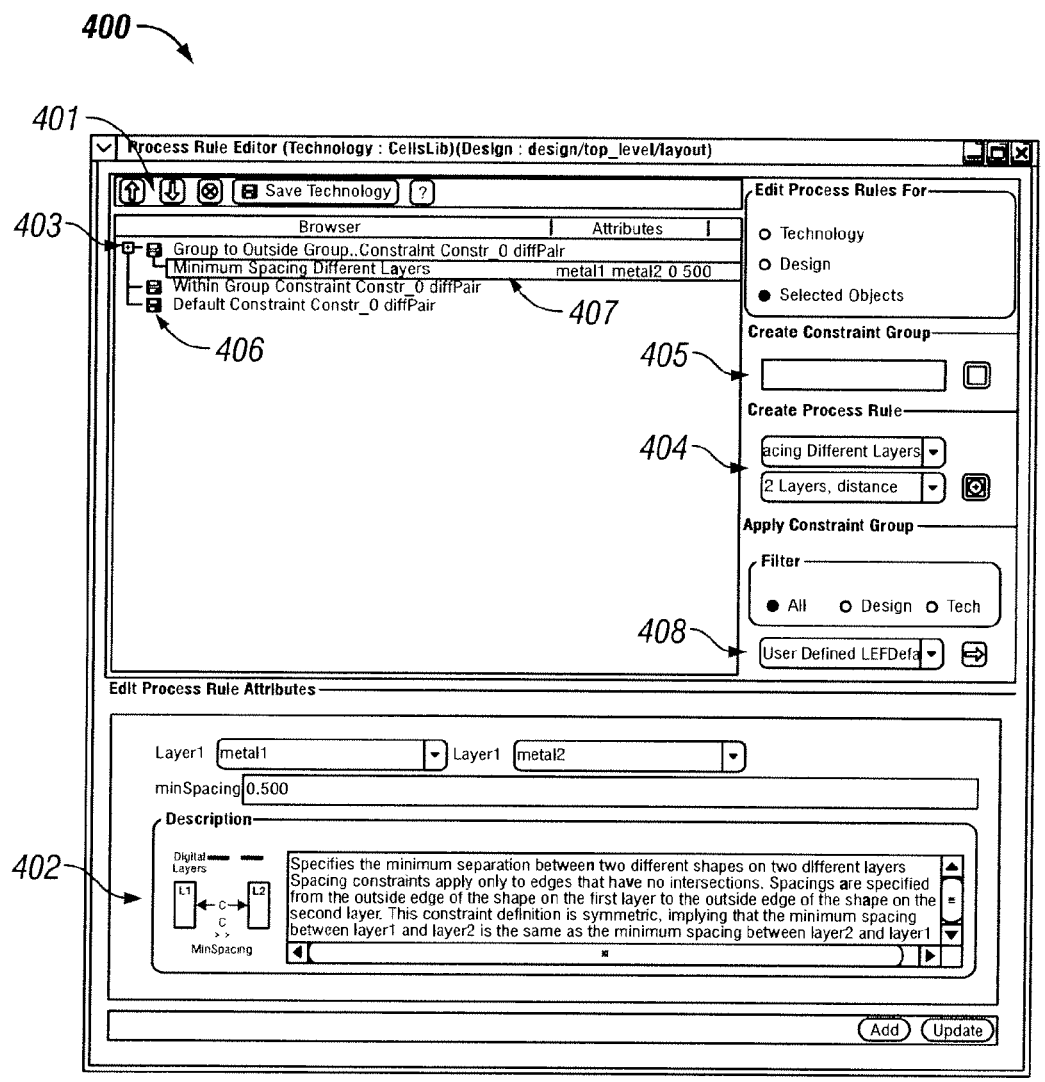
FIG. 4 is a picture of an example graphical interface in accordance with one embodiment of the systems and methods described herein.

The relevant constraint groups retrieved from the design object store 130 are then displayed in the graphical interface at block 204. An example of such a graphical display can be a browser tree, such as the one shown in element 403 of FIG. 4. FIG. 4 illustrates an example of the PRE 120 graphical user interface 400 and is discussed later in greater detail.

In another embodiment of the invention, the order of precedence of a circuit design constraint selected from the browser tree can be modified through a graphical interface, such as the graphical button 401 of FIG. 4. The graphical interface either moves the selected circuit design constraint higher or lower in order of precedence. In some embodiments, the modification of the order of precedence is reflected in the browser display 403 as the modification is being made. Such modifications are stored in the circuit design object store 130.

Figure 3:
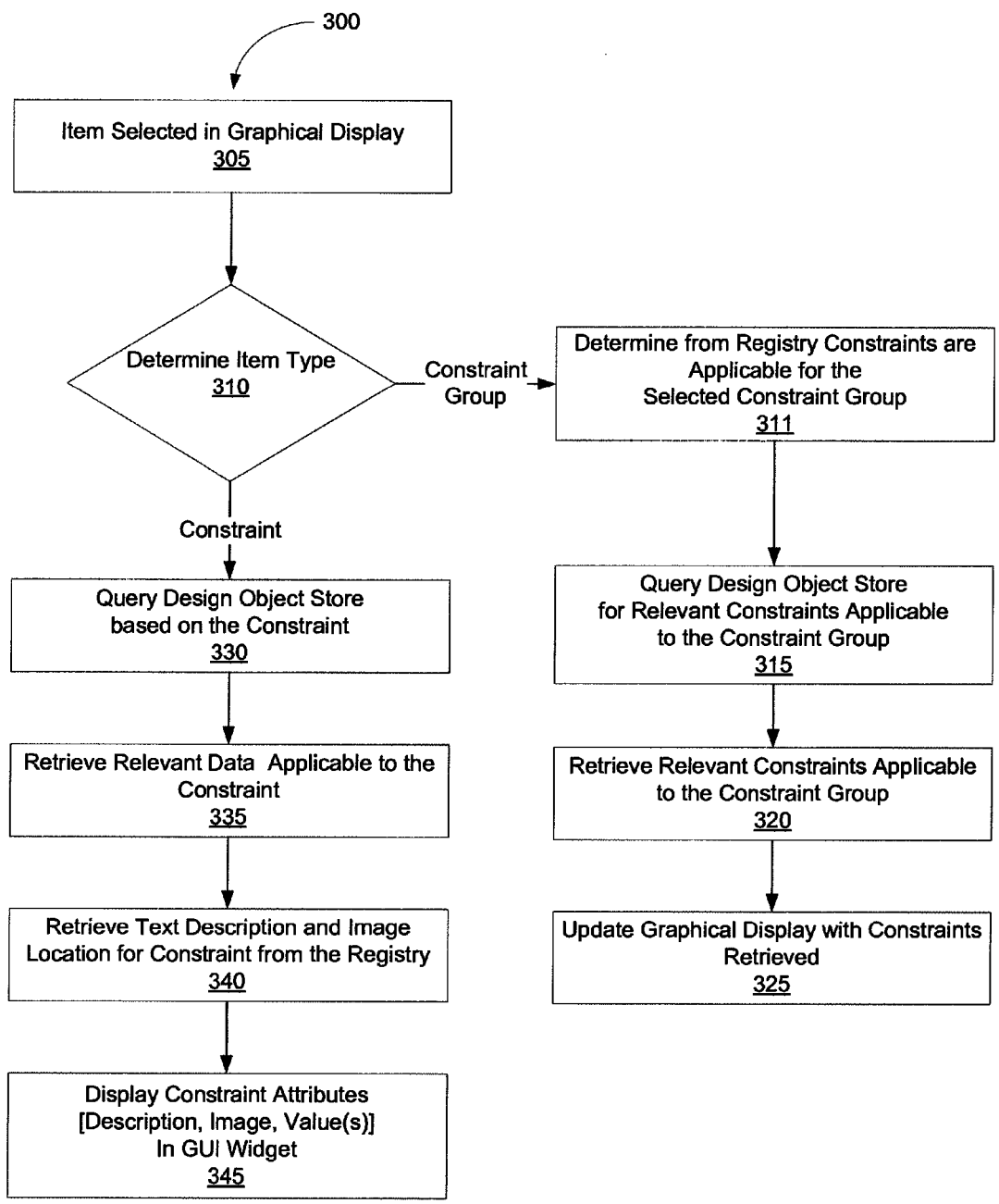
FIG. 3 is a flowchart illustrating an example method of processing a selection from a graphical display tree in accordance with an embodiment of the systems and methods described herein.

FIG. 3 is a flowchart illustrating an example method of processing an item selection from a graphical display, such as browser tree 403, in accordance with an embodiment of the systems and methods described herein. Specifically, in the illustrated example, when an item is selected in the graphical display, method 300 is invoked. In an example embodiment of the invention, the item selected would be, for example, an entry 406 or subentry 407 on the browser tree 403. In accordance with this embodiment of the invention, when an item is selected in the browser tree 403 (block 305), the PRE 120 determines what type of item has been selected (block 310).

If it is determined that a circuit design constraint group has been selected at block 310, the PRE 120 determines from the registry 140 at block 311 what circuit design constraints are applicable for the circuit design constraint group selected at block 310. The PRE 120 then queries the design object store 130 for those applicable circuit design constraints at block 315 and retrieves them at block 320. Finally, these retrieved circuit design constraints are displayed in the graphical display at block 325. In some embodiments, the browser tree 403 in the graphical display is updated with the retrieved circuit design constraints.

The registry 140 is capable of storing data that include, but are not limited to, the association between constraints and constraint groups, textual descriptions of constraints, and locations of images that represent the constraints. An example implementation of a registry includes, but is not limited to, a configuration file and a database. An integrated development environment, such as Cadence Virtuoso XL, is configured to make use of such data from the registry 140.

If it is determined a circuit design constraint is selected at block 310, the PRE 120 queries the design object store 130 at block 330 for data relevant to the circuit design constraint selected. The relevant data is retrieved from the design object store 130 at block 335. At block 340, the text description and image location associated with the circuit design constraint can also be retrieved from registry 140 if present. In some embodiments, the circuit design constraint's retrieved data (its associated value or values, text description, image location) are referred to as attributes of the circuit design constraint. At block 345, these attributes are passed on to a graphical user interface widget invoked by the PRE 120. The type of graphical user interface widget invoked is based upon the type of value or values the selected circuit design constraint (process rule) has. In some embodiments, the PRE 120 possesses the ability to load and invoke the graphical user interface widget as a separate plug-in module, allowing more graphical user interface widgets to be created in the future to handle the demands of future circuit design constraint (process rule) types.

In some embodiments, a graphical editor panel, such as the one illustrated in element 402 of FIG. 4, is the graphical user interface widget invoked by PRE 120. In such an embodiment, the graphical editor panel would be invoked and propagated with the selected circuit design constraint's attributes at block 345. In further embodiments, the appearance of graphical editor panel 402 is based upon the value type or data type of the circuit design constraint's attribute. The data and value types of the selected circuit design constraint can include, but are not limited to, integers, floats, one-dimensional tables, 2-dimensional tables, booleans, and arrays. For example, if the attribute is a two-dimensional table, a graphical interface resembling a two-dimensional table is displayed in the graphical editor panel. The graphical editor panel is configured to modify the attributes it displays and save those modifications to the design object store 130. In addition, the editor panel is configured to display and modify a textual description or image associated with the circuit design constraint. Such descriptions, images, and associations are stored within the registry 140.

FIG. 4 illustrates an example graphical user interface in accordance with one embodiment of the systems and methods described herein. The graphical user interface 400 in this example includes a graphical button interface 401; an editor panel 402, a browser tree 403, which has entries 406 and subentries 407; a graphical pull-down box 404; a graphical input box 405; and another graphical pull-down box 408. As disclosed above, in some embodiments of the invention, the graphical button interface 401 is configured to set the precedence of a circuit design constraint selected in the graphical browser 403. In other embodiments of the invention, the editor panel 402 can be displayed to view and/or edit a constraint selected in the browser tree 403.

In one embodiment of the invention, the graphical pull-down box 404 is configured to add a circuit design constraint to a circuit design constraint group selected in the browser tree 403. Similarly, in another embodiment of the invention, the graphical input box 405 can be utilized to create new constraint groups. In yet another embodiment, the graphical pull-down box 408 is configured to add a circuit design constraint group to a circuit design constraint group selected in the browser tree 403.

Figure 5:
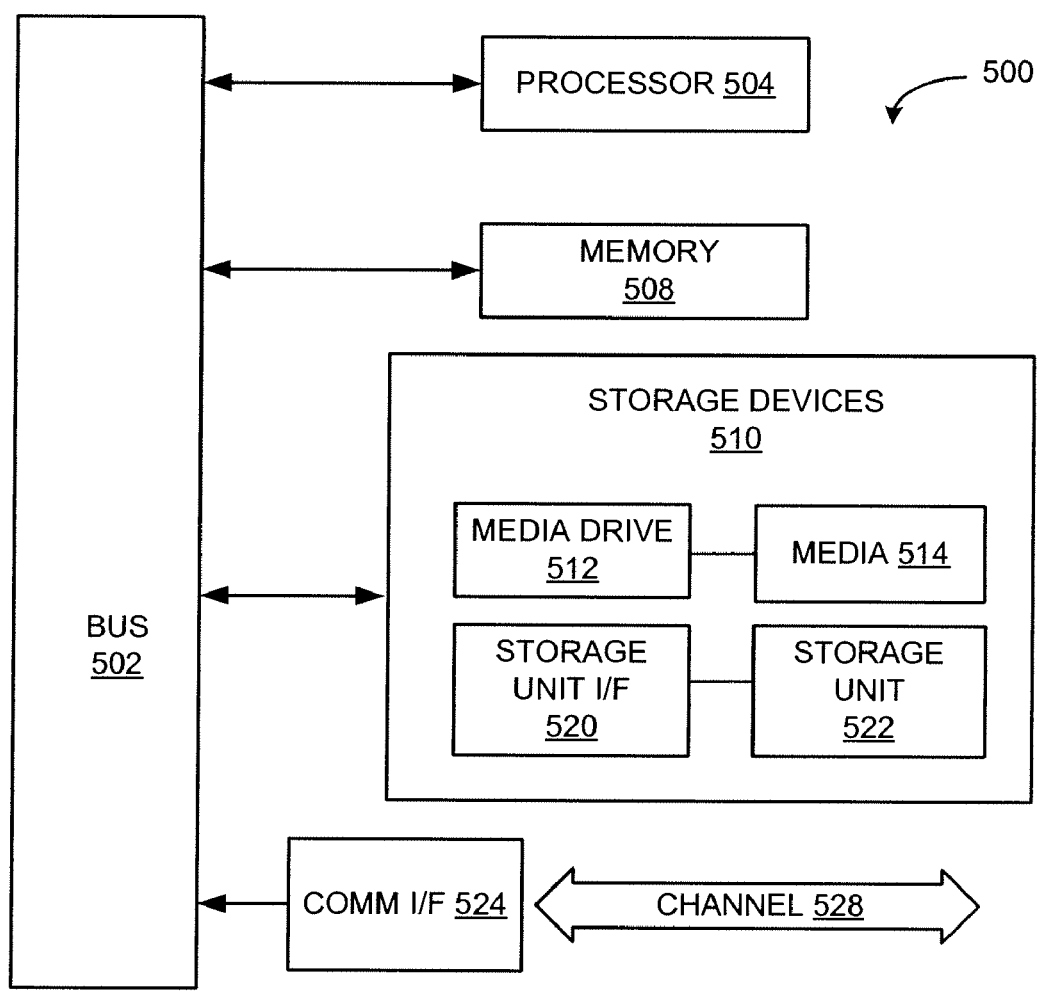
FIG. 5 is a diagram illustrating a computer system that can be used in conjunction with the systems and methods described herein.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Where components or modules of the invention are implemented in whole or in part using software, in one embodiment, these software elements can be implemented to operate with a computing system capable of carrying out the functionality described with respect thereto. One such example computing system is shown in FIG. 5. Various embodiments are described in terms of this example computing system 500. After reading this description, it will become apparent to a person skilled in the relevant art how to implement the invention using other computing systems or architectures.

Referring now to FIG. 5, computing system 500 may represent, for example, desktop, laptop and notebook computers; hand-held computing devices (PDA's, smart phones, cell phones, palmtops, etc.); mainframes, supercomputers, workstations or servers; or any other type of special or general purpose computing devices as may be desirable or appropriate for a given application or environment. Computing system 500 can also represent computing capabilities embedded within or otherwise available to a given device. Computing system 500 can include one or more processors, such as a processor 504. Processor 504 can be implemented using a general-purpose or special-purpose processing engine such as, for example, a microprocessor, controller, or other control logic. In the example illustrated in FIG. 5, processor 504 is connected to a bus 502 or other communication medium to facilitate interaction with other components of computing system 500.

Computing system 500 can also include a main memory 508, preferably random access memory (RAM) or other dynamic memory, for storing information and instructions to be executed by processor 504. Main memory 508 also may be used for storing temporary variables or other intermediate information during execution of instructions to be executed by processor 504. Computing system 500 can likewise includes a read only memory ("ROM") or other static storage device coupled to bus 502 for storing static information and instructions for processor 504.

The computing system 500 can also include information storage mechanism 510, which can include, for example, a media drive 512 and a storage unit interface 520. The media drive 512 can include a drive or other mechanism to support fixed or removable storage media. For example, a hard disk drive, a floppy disk drive, a magnetic tape drive, an optical disk drive, a CD or DVD drive (R or RW), or other removable or fixed media drive. Storage media 514, can include, for example, a hard disk, a floppy disk, magnetic tape, optical disk, a CD or DVD, or other fixed or removable medium that can be read by and written to by media drive 512. As these examples illustrate, the storage media 514 can include a computer usable storage medium having stored therein particular computer software or data.

In alternative embodiments, information storage mechanism 510 may include other similar instrumentalities for allowing computer programs or other instructions or data to be loaded into computing system 500. Such instrumentalities can include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing system 500.

Computing system 500 can also include a communications interface 524. Communications interface 524 can be used to allow software and data to be transferred between computing system 500 and external devices. Examples of communications interface 524 can include a modem or softmodem, a network interface (such as an Ethernet, network interface card, or other interface), a communications port (such as for example, a USB port, IR port, RS232 port or other port), or other communications interface. Software and data transferred via communications interface 524 are carried on signals, which can be electronic, electromagnetic, optical or other signals capable of being received by a given communications interface 524. These signals can be provided to communications interface 524 via a channel 528. This channel 528 can carry signals and can be implemented using a wired or wireless medium. Some examples of a channel can include a phone line, a cellular phone link, an RF link, an optical link, a network interface, a local or wide area network, and other communications channels.

In this document, the terms "computer program medium" and "computer usable medium" are used to generally refer to media such as, for example, memory 508, storage unit 520, media 514, and signals on channel 528. These and other various forms of computer usable media may be involved in carrying one or more sequences of one or more instructions to processor 504 for execution. Such instructions, generally referred to as "computer program code" (which may be grouped in the form of computer programs or other groupings), when executed, enable the computing system 500 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which each block is presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for graphically editing process rules for circuit designs, comprising:
   using a computer system to receive a selection of a circuit design object or a circuit design constraint, wherein the selection comes from a circuit design integrated design environment;
   using a computer system to query a circuit design object store based on the circuit design object or circuit design selected, wherein the circuit design object store contains a plurality of relationships between circuit design objects and circuit design constraint groups;
   using a computer system to receive a first list from the circuit design object store, wherein the first list comprises a plurality of circuit design constraint groups based on the selection;
   using a computer system to display in a graphical user interface the first list received, wherein each circuit design constraint group in the first list is selectable; and
   when a circuit design constraint group in the first list is selected, performing the operations of:
   (a) retrieving from a registry a second list, wherein the second list comprises a plurality of circuit design constraints applicable to the circuit design constraint group selected,
   (b) querying the design object store for circuit design constraints contained in the second list,
   (c) receiving a third list from the design object store, wherein the third list comprises the plurality of circuit design constraints from the second list and a plurality of data belonging to the circuit design constraints from the second list, and
   (d) displaying the third list in the graphical user interface.

2. The method of claim 1, wherein the first list displayed in the graphical user interface is presented in a browser tree having a plurality of entries and a plurality of subentries, the entries corresponding to different circuit design constraint groups in the first list.

3. The method of claim 1, wherein when a new circuit design constraint group is created through the graphical user interface, the new circuit design constraint group is added to the circuit design object store, and when an existing circuit design constraint group is removed through the graphical user interface, the existing circuit design constraint group is removed from the circuit design object store.

4. The method of claim 2, further comprising:
   determining when an entry on the browser tree is selected; and
   determining whether the entry selected is a circuit design constraint group or a circuit design constraint.

5. The method of claim 4, for a selection that is a circuit design constraint, performing the operations of:
   (a) querying a design object store for the circuit design constraint selected,
   (b) receiving a data from the registry store relating to the circuit design constraint selected, wherein the data comprises the circuit design constraint's attributes,
   (c) invoking a graphical user interface widget for the circuit design constraint, and
   (d) passing the graphical user interface widget the data retrieved from the design object store.

6. The method of claim 4, wherein for a selection that is a circuit design constraint group, when an existing circuit design group is added to or removed from the circuit design constraint group through the graphical user interface, the design object store updated accordingly.

7. The method of claim 4, wherein for a selection that is a circuit design constraint, the circuit design constraint has a precedence order in relation to other circuit design constraints in a second list, the subentry is displayed based upon the precedence order of the circuit design constraint it represents, and the precedence order of the circuit design constraint is modified and updated to the circuit design object store through the graphical user interface.

8. The method of claim 4, wherein the graphical user interface further presents an editor panel and the editor panel is configured based upon a value type of the circuit design constraint.

9. The method of claim 4, wherein the graphical user interface further presents an editor panel and the editor panel can display or edit an attribute, a description, or an image of the circuit design constraint stored in the registry store.

10. A method for graphically editing process rules for circuit designs performed by a computer program product having computer readable program codes stored in a non-transitory computer useable medium, the computer readable program codes when executed by a computer, enable the computer to perform operations comprising:
    receiving a selection of a circuit design object or a circuit design constraint, wherein the selection comes from a circuit design integrated design environment;
    querying a circuit design object store based on the circuit design object or the circuit design constraint selected, wherein the circuit design object store contains a plurality of relationships between circuit design objects and circuit design constraint groups;
    receiving a first list from the circuit design object store, wherein the first list comprises a plurality of circuit design constraint groups based on the selection; and
    using a computer system to display in a graphical user interface the first list received, wherein each circuit design constraint group in the first list is selectable; and
    when a circuit design constraint group in the first list is selected, performing the operations of:
    (a) retrieving from a registry a second list, wherein the second list comprises a plurality of circuit design constraints applicable to the circuit design constraint group selected,
    (b) querying the design object store for circuit design constraints contained in the second list,
    (c) receiving a third list from the design object store, wherein the third list comprises the plurality of circuit design constraints from the second list and a plurality of data belonging to the circuit design constraints from the second list, and
    (d) displaying the third list, wherein the circuit design constraint in the third list is displayed in the browser tree as a subentry under the circuit design constraint group to which it belongs.

11. The method of claim 10, wherein when a new circuit design constraint group is created through the graphical user interface, the new circuit design constraint group is added to the circuit design object store, and when an existing circuit design constraint group is removed through the graphical user interface, the existing circuit design constraint group is removed from the circuit design object store.

12. The method of claim 10, wherein the first list displayed in the graphical user interface is presented in a browser tree having a plurality of entries and a plurality of subentries, the entries corresponding to different circuit design constraint groups in the first list, the method further comprising:
    determining when an entry on the browser tree is selected; and
    determining whether the entry selected is a circuit design constraint group or a circuit design constraint.

13. A system for graphically editing process rules for circuit designs, comprising:
    a processor,
    a memory, coupled to the processor and configured to cause the processor to perform a stored sequence of instructions comprising:
    receiving a selection of a circuit design object, wherein the selection is made by a user on a circuit layout canvas presented by a graphical user interface of a circuit design integrated design environment, and wherein the circuit layout canvas displays the circuit design object within a circuit design schematic;
    for the selection, querying a circuit design object store based on the selection, wherein the circuit design object store contains a plurality of relationships between a circuit design object and circuit design constraint groups, and
    receiving a first list from the circuit design object store relevant to the selection, wherein the first list comprises a plurality of circuit design constraint groups based on the selection; and
    displaying in the graphical user interface the first list received, wherein each circuit design constraint group in the first list is selectable; and
    when a circuit design constraint group is selected, performing the operations of:
    (a) retrieving from a registry a second list, wherein the second list comprises a plurality of circuit design constraints applicable to the circuit design constraint group selected,
    (b) querying the design object store for circuit design constraints contained in the second list,
    (c) receiving a third list from the design object store, wherein the third list comprises the plurality of circuit design constraints from the second list and a plurality of data belonging to the circuit design constraints from the second list, and (d) displaying the third list, wherein the circuit design constraint in the third list is displayed in the browser tree as a subentry under the circuit design constraint group to which it belongs.

14. The system of claim 13, wherein the first list displayed in the graphical user interface is presented in a browser tree having a plurality of entries and a plurality of subentries, the entry corresponding to a different circuit design constraint group in the first list.

15. The system of claim 14, further comprising:
determining when an entry on the browser tree is selected; and
determining whether the entry selected is a circuit design constraint group or a circuit design constraint.

16. The system of claim 15, for a selection that is a circuit design constraint, performing the operations of:
(a) querying a design object store for the circuit design constraint selected,
(b) receiving a data from the registry store relating to the circuit design constraint selected, wherein the data comprises the circuit design constraint's attributes,
(c) invoking a graphical user interface widget for the circuit design constraint, and
(d) passing the graphical user interface widget the data retrieved from the design object store.

17. The system of claim 15, wherein for a selection that is a circuit design constraint group, when an existing circuit design group is added to or removed from the circuit design constraint group through the graphical user interface, the design object store updated accordingly.

18. The system of claim 15, wherein for a selection that is a circuit design constraint, the circuit design constraint has a precedence order in relation to other circuit design constraints in a second list, the subentry is displayed based upon the precedence order of the circuit design constraint it represents, and the precedence order of the circuit design constraint is modified and updated to the circuit design object store through the graphical user interface.

19. The system of claim 15, wherein the graphical user interface further presents an editor panel and the editor panel is configured based upon a value type of the circuit design constraint.

20. The system of claim 15, wherein the graphical user interface further presents an editor panel and the editor panel can display or edit an attribute, a description, or an image of the circuit design constraint stored in the registry store.

21. The system of claim 13, wherein when a new circuit design constraint group is created through the graphical user interface, the new circuit design constraint group is added to the circuit design object store, and when an existing circuit design constraint group is removed through the graphical user interface, the existing circuit design constraint group is removed from the circuit design object store.

* * * * *